United States Patent [19]

Meyer et al.

[11] Patent Number: 5,097,136
[45] Date of Patent: Mar. 17, 1992

[54] APPARATUS FOR CURING PHOTOSENSITIVE COATINGS

[75] Inventors: Ronald A. Meyer, Bayfield; William D. Burch, Cangas; Alexander Waluszko, Pasadena, all of Calif.

[73] Assignee: Ultra-Lum, Inc., Carson, Calif.

[21] Appl. No.: 529,371

[22] Filed: May 29, 1990

[51] Int. Cl.⁵ .................................................. G01J 1/00
[52] U.S. Cl. .............................. 250/492.1; 250/504 R
[58] Field of Search .............. 250/492.1, 493.1, 504 R

[56] References Cited

U.S. PATENT DOCUMENTS

| | | | |
|---|---|---|---|
| 1,190,071 | 7/1916 | Adams | 250/504 R |
| 1,586,670 | 6/1926 | Girard | 250/504 R |
| 2,375,354 | 5/1945 | Ellner | 250/504 R |
| 3,733,709 | 5/1973 | Bassemir et al. | 250/504 R |
| 3,826,014 | 7/1974 | Helding | 250/504 R |
| 3,930,318 | 1/1976 | Stelter et al. | 250/504 R |
| 4,025,795 | 5/1977 | Lackore et al. | 250/504 R |

*Primary Examiner*—Bruce C. Anderson
*Attorney, Agent, or Firm*—Irving B. Osofsky

[57] ABSTRACT

A compact automatic apparatus for rapidly curing photosensitive coatings on eyeglass lenses. A precision adjustable automatic programmer controls process cycling, ultraviolet intensity and radiation time. A control panel is used to switch the apparatus on or off and to manually select cycle parameters. The apparatus electronically monitors radiation intensity and uses a flashing light to warn the operator of low ultraviolet intensity. Apparatus components are cooled by a filtered force air convection system that prevents flow of unfiltered air into the apparatus. An automatically programmed linear motion lens transport carriage passes through an automatic outer door which allows inward and outward passage of the lens while protecting the operator from ultraviolet radiation. The outer door shields the machine interior from dirt and dust. After the outer door closes behind the entering lens, the lens transport carriage speed changes to a preselected irradiation cycle speed and an automatic shutter opens to allow the ultraviolet radiation to reach the lens. Ultraviolet radiation is supplied by a cylindrical ultraviolet lamp in the radiation chamber. At the proper time, the shutter closes and the lens transport carriage reverses direction, lens transport carriage speed changes to transport speed, and the lens transport carriage moves the lens out to the loading/unloading station through the outer door which opens and closes automatically.

10 Claims, 8 Drawing Sheets

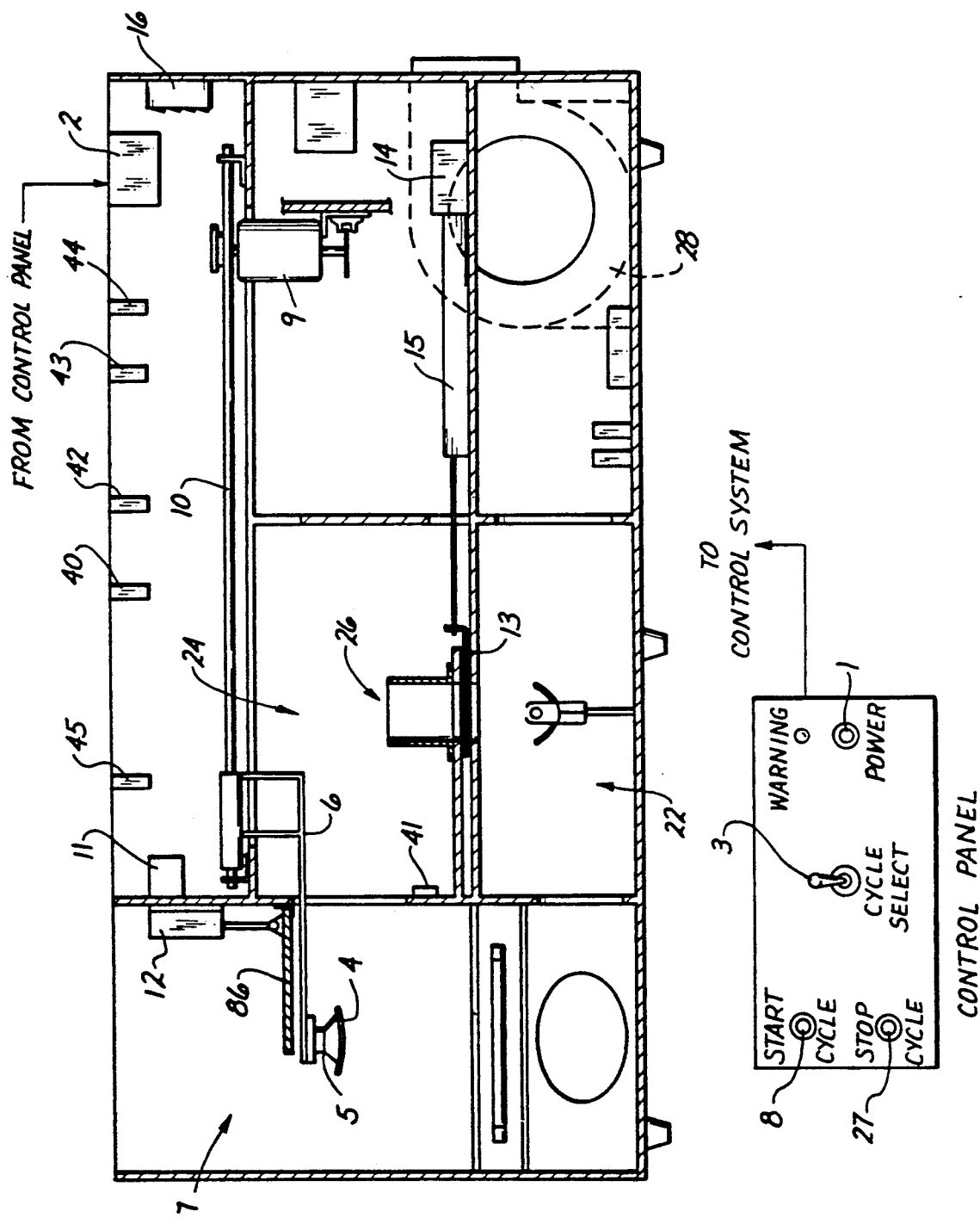

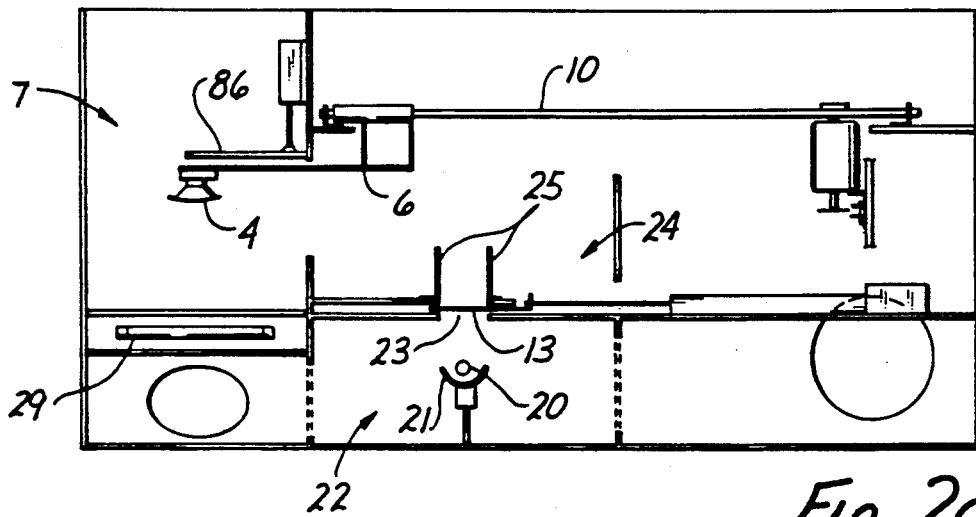
Fig. 2a
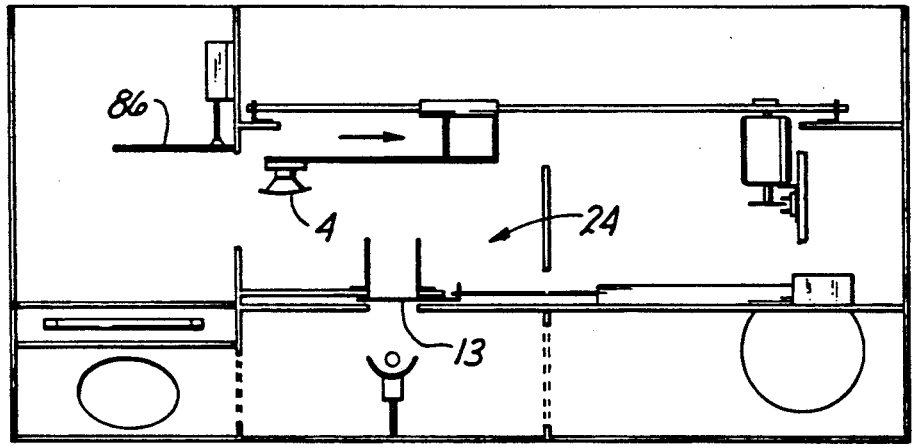
Fig. 2b
Fig. 2c
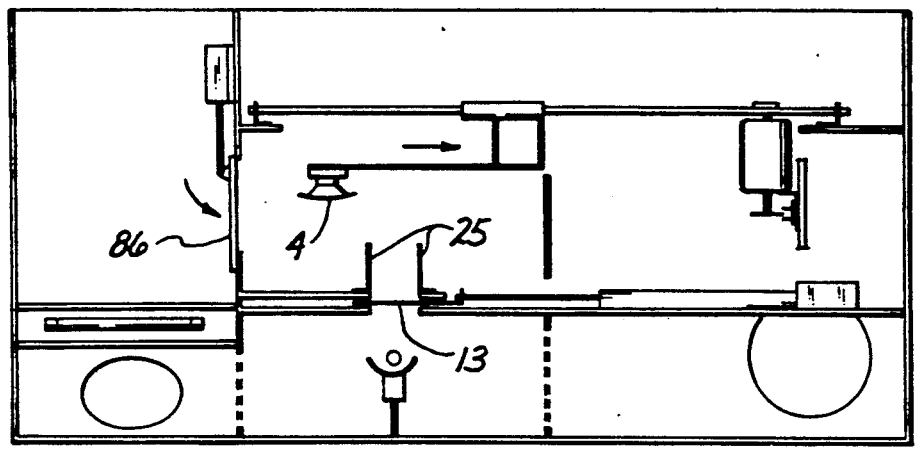

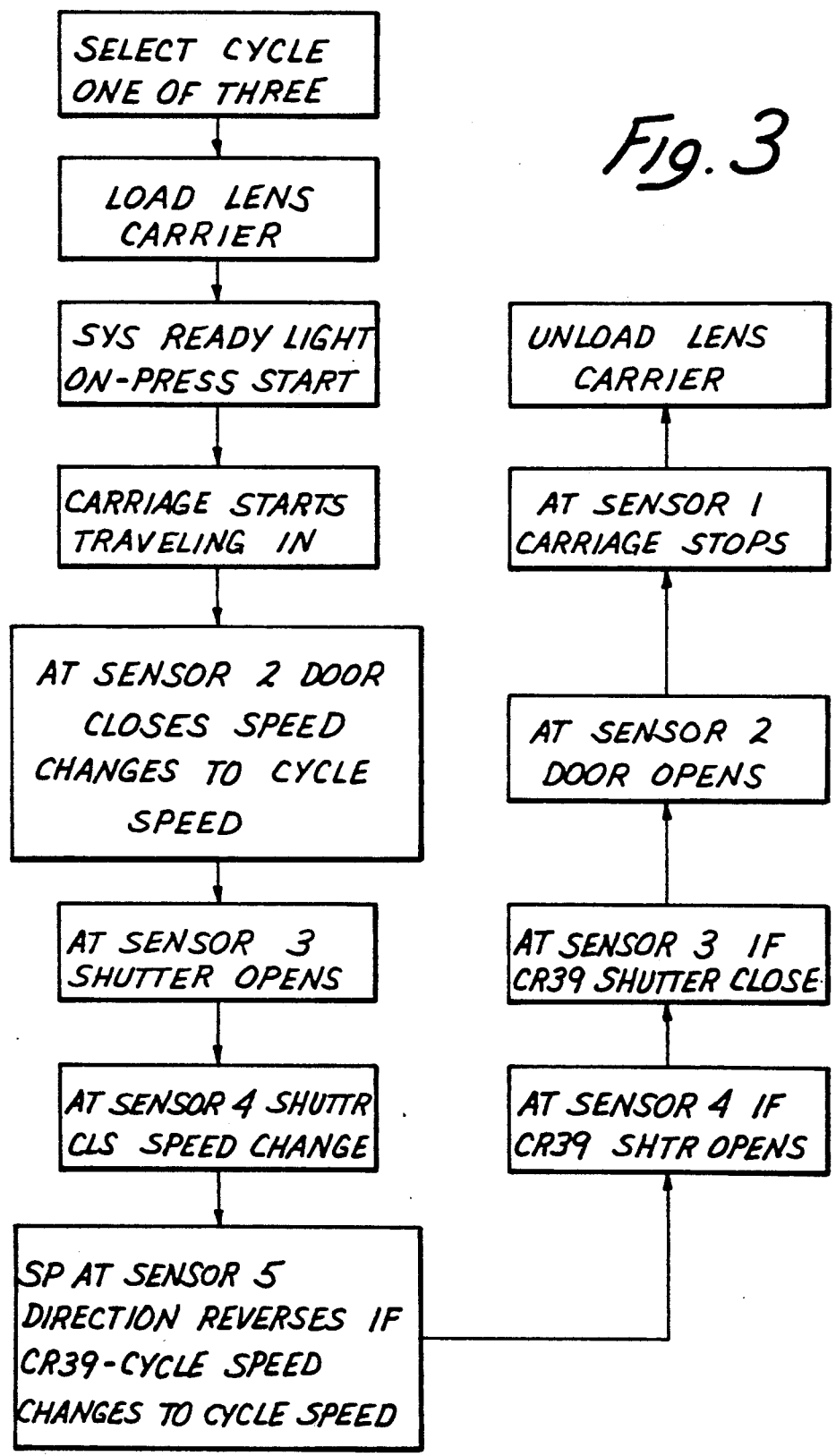

APPARATUS FOR CURING PHOTOSENSITIVE COATINGS

BACKGROUND OF THE INVENTION

Plastic eyeglass lenses have been known and have been in common use for many years. They have two principal advantages, namely they are light weight as compared to equivalent optical glass lenses and they meet state requirements as safety glasses. The primary disadvantage of plastic lenses is that they are easily scratched in normal use and these scratches interfere with their primary function of providing clear vision. Another disadvantage of plastic lenses is that they are difficult to tint in their normal state.

Lens manufacturers have developed very thin proprietary coatings that protect the plastic lens from scratching in normal use and that provide a means for tinting. These coatings are manufactured to be photosensitive to ultraviolet radiation and can be cured to a hardened state by exposure to the proper wave lengths at the proper intensity for a precise time. The hardness, durability and optical properties of the coating depend on precise exposure to ultraviolet radiation. Therefore machines for curing optical lens coatings must be capable of accuracy in radiation intensity, radiation wave lengths and in time of exposure to radiation. Speed of processing is also an important parameter because cycling time directly affects the cost of processing.

The inventors have found that there were commercially available machines for curing photosensitive protective films applied to eyeglass lenses but they were very expensive. They designed a compact apparatus that used state-of-the-art electronics to precisely control cycle parameters such as lens transport speed and radiation exposure time. They developed a special radiation collimator which intensified the lens deposited radiation allowing use of a lower power and less expensive ultraviolet lamp. The apparatus was designed so that the lenses were loaded, transported through the apparatus and unloaded in an inverted position so that dust and dirt would not settle on the coated surface. They also used protective door position sensors to assure operator safety by automatically preventing escape of radiation into the workspace.

The inventors have also researched the literature and discuss the following patents which may be construed as having somewhat similar function:

1. U.S. Pat. No. 3,826,014 by Helding describes an apparatus for ultraviolet curing of solvent free ink by photopolymerization. A reflector behind each lamp directs radiation towards the transport "web" belt. It has a light absorbing shutter in front of each lens that automatically opens and an air duct to cool the lamp terminals and draw off ozone and heated gases. This use of a reflector behind the ultraviolet lamp to direct radiation from the rear of the lamp to the front is not new and has been known from the time of wax candles. The inventors do not claim any novelty in the use of such a rear reflector. This referenced patent does disclose a light absorbing shutter in front of each lens to block escape of radiation to a moving transport belt if desired. Again, this application of a shutter to block unwanted radiation is not novel and has been used in motion picture projectors, cameras, naval signal lamps and the like for many years. In the present invention, an automatically controlled door and shutter are used to prevent escape of radiation from a radiation chamber as a regular part of the process for operator safety and for exposure control.

2. U.S. Pat. No. 3,950,650 by Pray & Foster, discloses an apparatus for ultraviolet curing of solvent free ink by photopolymerization. A reflector behind each lamp directs radiation towards the transport "web" belt. Cooling air passages are designed to cool terminals, reflectors, etc. without cooling the ultraviolet lamp body. This system of cooling terminals, reflectors, etc. has been and is in common use in motion picture and slide projectors. Its use in conjunction with an ultraviolet lamp is not novel and the present invention treats cooling of these items as a standard engineering practice.

3. U.S. Pat. No. 4,471,226 by Wisnosky, discloses an improved safety housing for a radiation source with mechanical interlocks to prevent activation of the source unless the protective shield is in place. This reference differs from the present invention because in the present invention the radiation source is continually actuated and two automatically actuated doors in series with each other are prevented from opening at the same time by electrical controller logic which obtains individual door open/close status from individual position sensors. Therefore safety is obtained by assuring that at least one door is always completely shut at all times while the radiation source is energized.

SUMMARY OF THE PRESENT INVENTION

The present invention is an inexpensive compact automatic apparatus for rapidly ultraviolet curing pre-applied photosensitive coatings on eyeglass lenses. These cured coatings provide an optically transparent scratch resistant protective surface over the lens and a method of tinting plastic lenses that are unable to be tinted in the uncoated state.

BRIEF DESCRIPTION OF THE DRAWINGS

FIG. 1 is a cross section of the invention showing the two sequentially opening doors, the linear lens transport system, the motor drive, the system controller, the irradiation lamp, the reflector system, the cooling system and the control panel.

FIG. 2-A is a schematic of the invention showing the primary components of the invention with the coated lens at the load/unload station.

FIG. 2-B shows that the lens has passed through the outer door while the inner door (shutter) is closed.

FIG. 2-C shows that both the outer door and the inner door (shutter) are closed with the lens between them.

FIG. 2-D shows that the lens is passing over the radiation chamber with the inner door (shutter) open and the outer door closed.

FIG. 3 is a block diagram showing the mechanical operation of the invention.

DETAILED DESCRIPTION OF THE INVENTION

Figure 2D:
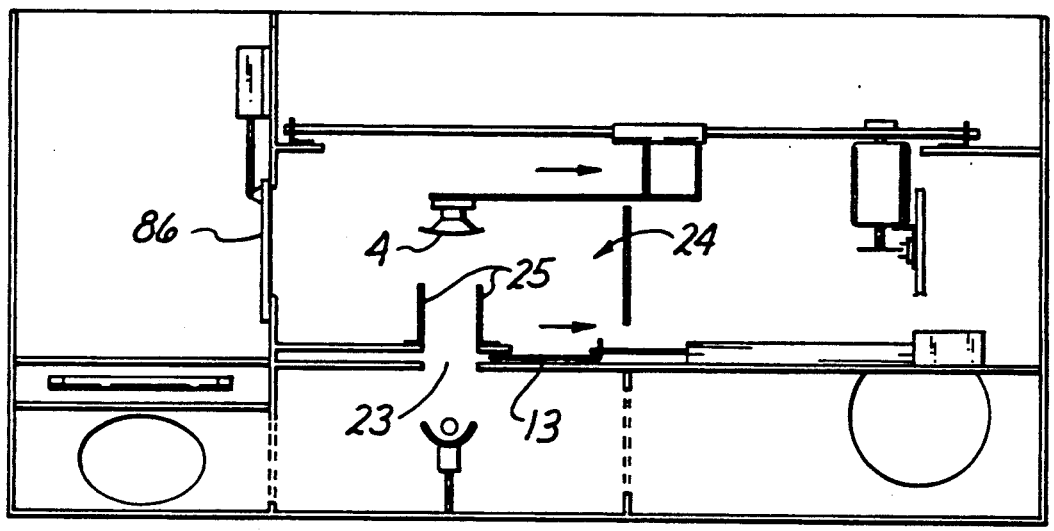
FIG. 2 schematically illustrates the sequential operation of the invention.

Referring now in detail to FIG. 1, after the apparatus is energized by actuation of power switch 1, which switches external power to the control system 2, the human machine operator selects one of three cycle speeds by toggling cycle speed switch 3, to the desired speed, manually loads a lens precoated with an uncured photo sensitive coating 4, attached to a magnetic base suction cup holder 5, onto a lens transport carriage 6, at the loading/unloading station 7, and presses start cycle switch 8, to start the ultraviolet coating curing process. At any time, if necessary, the operator can stop the apparatus by actuating the stop cycle switch 27. Drive motor 9, which moves the linear conveyor 10, that moves the lens transport carriage is actuated to run in the proper feed direction at a preset transport speed by the control system in response to actuation of start cycle switch 8. Outer door 86, is normally open to allow entry of the lens with the uncured coating into the apparatus radiation chamber 24. After the lens (coated with uncured coating), passes into the apparatus through the open outer door and the lens transport carriage actuates an infra-red sensor 40, the control system sequentially closes the outer door by actuating solenoid valve 11, to admit compressed air to pneumatic actuator 12. When outer door sensor 41, indicates closure of the outer door and the lens transport carriage passes shutter sensor 42, the control system opens the shutter 13, by actuating solenoid valve 14, to admit compressed air to pneumatic actuator 15. The control system changes the drive motor speed from the transport speed to the preselected cycle speed and the lens passes over the radiation passage 26, leading from the lamp chamber 87. When infra-red sensor 43, senses that the lens is clear of the radiation chamber opening (by actually sensing the lens transport carriage position which indicates that the photosensitive coating cure cycle is complete), it signals the control system which closes the shutter by means of its pneumatic actuator. When the linear drive system reaches the limit of its inward travel, the lens transport carriage actuates sensor 44, which signals the controller to reverse the rotational direction of the drive motor. The controller also changes drive motor speed to transport speed and moves the cured lens out of the radiation chamber, opens the outer door and returns the lens to the load/unload station where the operator unloads the processed lens and loads the next coated lens. The linear drive motor stops when sensor 45, signals the controller that the lens on the lens transport carriage has reached the load/unload station.

When the apparatus is energized, fan 16, continuously forces filtered air through the apparatus exiting through the open outer door to prevent dust and particulates from entering the apparatus and to cool the upper part of the apparatus. Blower 28, forces cooling air to flow into the ultraviolet lamp chamber 22, through baffles to cool the ultraviolet lamp, its electrical terminals, the ultraviolet reflectors and electrical components.

FIG. 2 is an operational schematic of the invention and shows the main sequential movements of the lens through the cure cycle.

FIG. 2-A shows the pre-coated lens 4, at loading/unloading station 7, on lens transport carriage 6, a linear conveyor 10, with outer door 86, open and shutter 13, closed. Ultraviolet irradiation lamp 20, is energized and is radiating into the ultraviolet lamp chamber 22. Parabolic reflector 21, focuses and reflects the ultraviolet radiation so that it is directed up through radiation port 23. Shutter 13, blocks the radiation from entering radiation chamber 24. Ultraviolet director 25, collimates and intensifies the ultraviolet radiation that illuminates the lens when the shutter is open. Inspection light 29, illuminates the lens with visible light at the loading/unloading station and allows the operator to readily detect coating imperfections as well as dust or dirt on a lens.

FIG. 2-B shows that the lens has passed through the normally open outer door into the radiation chamber while the shutter remains closed. This closed shutter prevents radiation from reaching the operator.

FIG. 2-C shows that both the shutter and outer door are closed as the lens approaches the shutter and ultraviolet director. This mutual door closure is a safety measure to prevent radiation leakage due to a possible timing malfunction.

FIG. 2-D shows that the shutter is fully open and the lens is passing over the ultraviolet director, the radiation port, and the open shutter while the outer door remains closed. Radiation escaping through the open shutter into radiation chamber 24, can not reach the operator because the outer door is closed and remains closed unless the shutter is completely shut.

FIG. 3 is a block diagram that shows the sequential operation of the invention. It operates as follows:

1. By operating the toggle switch on the control panel, the operator selects one of three available curing cycles as specified by the manufacturer of the photosensitive coating.
2. The operator loads the precoated lens that is already mounted on a magnetic base suction cup holder onto a lens transport carriage (carrier) at the loading/unloading station. The lens transport carriage is attached to a motor driven linear conveyor.
3. If the system ready light is "ON", the operator presses the start cycle switch which starts the automatic control system (controller). The lens and the lens transport carriage starts travelling at the transport speed away from the first position sensor 45, into the housing through the normally open outer door. When the lens transport carriage passes the outer door infra-red position sensor 40, the control system closes the normally open outer door and changes the linear drive speed from the standard transport speed to the selected cycle speed.
4. When the lens transport carriage passes shutter sensor 42, the control system opens the shutter 13, by actuating solenoid valve 14, to admit compressed air to pneumatic actuator 15. The lens passes through the ultraviolet radiation emanating from the radiation chamber through the open shutter, radiation port and director. The ultraviolet radiation cures the photosensitive lens coating. If outer door sensor 41 is installed and the signal used to enable shutter opening, it would indicate full outer door closure and act as a safety device to prevent inadvertent escape of ultraviolet light due to a system malfunction.
1. When the lens transport carriage passes sensor 43, the shutter closes and linear drive speed is changed from preselected cycle speed to the standard transport speed.
6. When the lens transport carriage actuates sensor 44, the control system reverses the direction of the linear drive to return the lens to the load/unload station, and if the proper cycle is selected, the linear drive speed changes back to the cycle speed for a second pass over the radiation port and the shutter opens. In any case, the shutter closes or remains closed as sensor 42, is passed as the lens transport carriage travels towards the loading/unloading station.
7. When the lens transport carriage passes sensor 40, on its way out to the loading/unloading station, the outer door opens.
8. When the lens transport carriage reaches sensor 45, the linear drive stops and the operator unloads the lens with the cured coating from the lens transport carriage.

The sensors referred to above (40, 42, 43, 44 and 45) are mounted so that a small arm (projection) of the lens transport carriage sequentially passes through the sensors to block passage of infra-red light at one sensor at a time, thereby signalling the control system that the lens carriage is at a specific station. These signals are processed by the control system to sequence door closures and openings, shutter openings and closures as well as speed and rotational direction of the drive motor.

The three curing cycles, referred to as cycle A, B and C are presently configured with the following characteristics:

| CYCLE | CHARACTERISTICS |
|---|---|
| A | Lens traverses ultraviolet lamp once at selected speed #1 and shutter closes. Lamp is at low power. |
| B | Lens traverses ultraviolet lamp once at selected speed #2 and shutter closes. Lamp is at low power. |
| C | Lens traverses ultraviolet lamp twice at selected speed #3 and shutter closes after the second traverse which is in the reverse direction. Lamp is at high power. |

Figure 4:
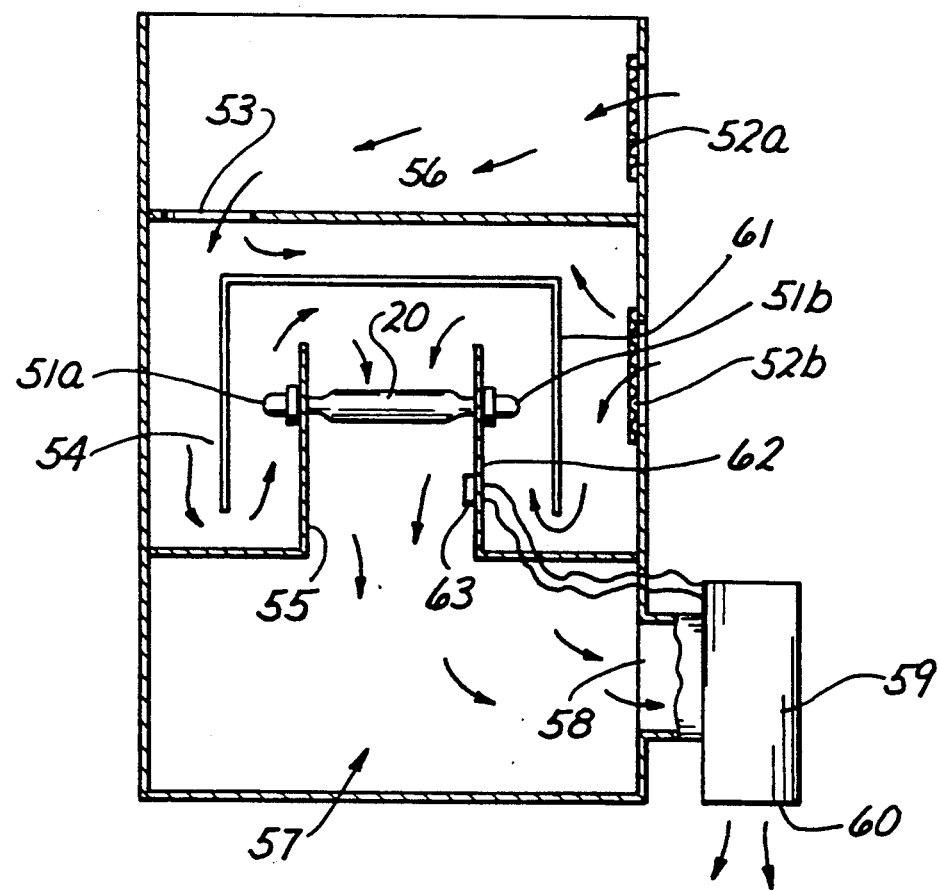
FIG. 4 is a schematic of the forced air cooling system for the ultraviolet lamp.

FIG. 4 is a schematic of the forced air ultraviolet lamp cooling system. The cylindrical ultraviolet lamp 20, has integral metal male electrodes at each end. These electrodes are flexibly supported in externally insulated female electrode holders 51a, and 51b. This flexible mounting minimizes stresses on the lamp and its electrodes by allowing for the free linear thermal expansion of the lamp during heatup and the free negative thermal expansion (shrinkage) during cooldown. Air passes into the apparatus through filtered port 52a, and a labyrinth that apportions cooling air to match the heat rejection of the component lamp parts and to avoid thermal shock on the quartz lamp cylinder. Approximately half of the air which passes through port 53, passes around baffle 54, turns to flow in a reverse direction in the passage between baffle 54, and baffle 55, over a lamp electrode and electrode holder 51a, and is warmed by the heated components. The air flow then changes direction by 90°, flowing over the end of baffle 55, through the passage between baffle 55, and baffle 56. After turning another 90°, the warmed air flows over and by the cylindrical ultraviolet lamp through passage 57, (which is within lamp chamber 22) out port 58, into the inlet of centrifugal blower 59, (which provides the required pressure differential) out to the atmosphere from port 60. This baffle arrangement results in long lamp life and reduces the heat flow to the other components of the apparatus.

The air flowing through filtered port 52b, flows around baffle 61, into the passage formed between baffle 61, and baffle 62, around and through the passage between baffle 62, and baffle 56. After turning another 90°, the air flows over and by the cylindrical ultraviolet lamp through chamber 57, out port 58, into the inlet of centrifugal blower 59, out port 60, to the atmosphere.

A temperature sensing switch 63, acts to turn on blower 59, after the ultraviolet lamp has time to warm up and heat the air near the switch to a temperature 110° F. This prevents thermal shock and improves the starting transient operation of the lamp.

Figure 5:
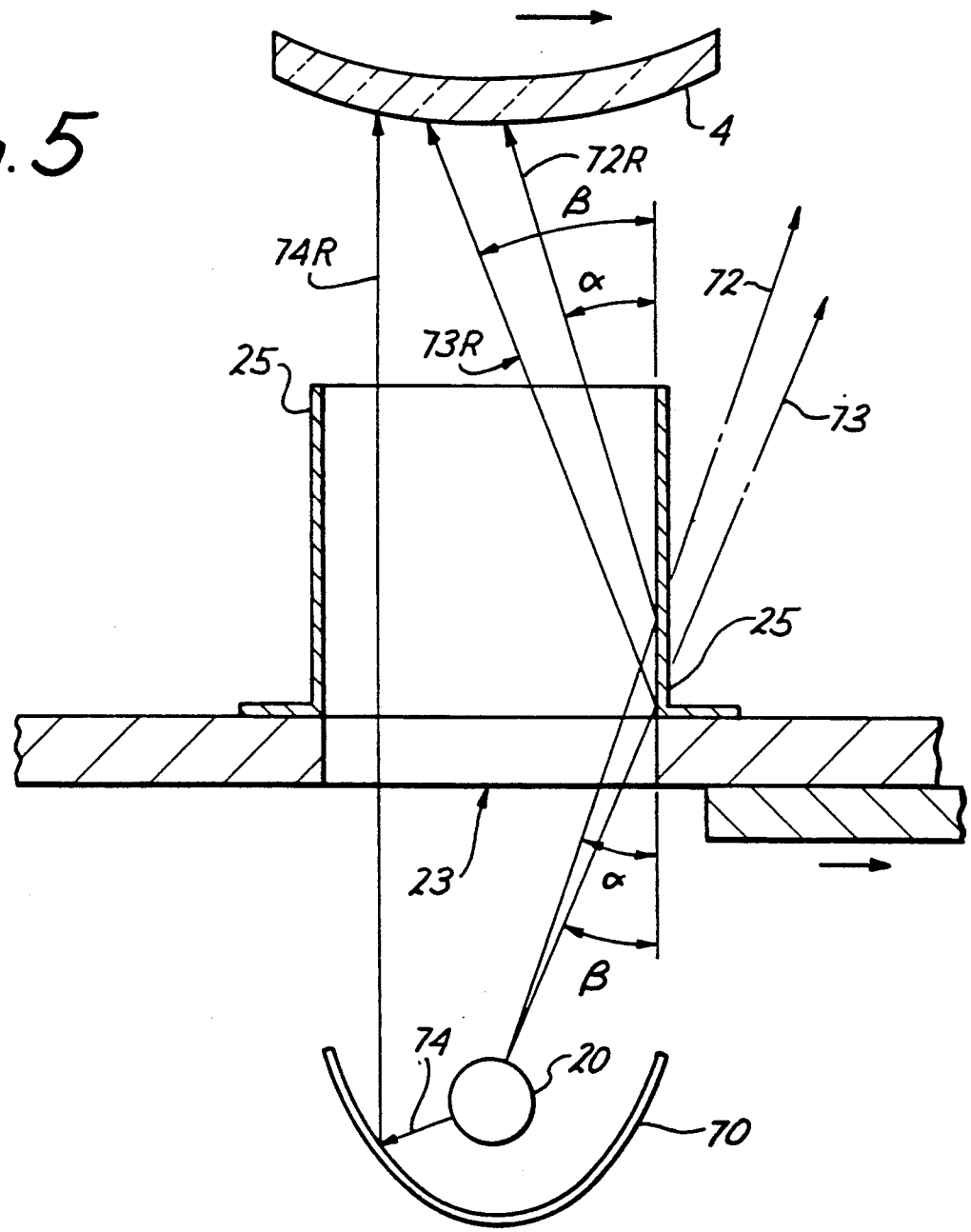
FIG. 5 is a schematic of the ultraviolet irradiation optical system.

FIG. 5 schematically illustrates the ultraviolet irradiation optical system. It is very important that the lens coating receive a uniform radiation flux as it traverses the radiation port so that all parts of the coating are fully and uniformly cured in a single pass or in some cases, a double pass. Failure to illuminate the lens in a repeatable uniform manner could result in areas of the coating being soft, having poor adhesion or being sticky. The radiation system described herein was designed to utilize as much of the ultraviolet lamp's output as practical and to direct it up to the lens coating that was being cured. There is a two dimensional parabolic mirror 70, parallel to and surrounding approximately a 180 angular degree arc of the cylindrical ultraviolet lamp 20. This mirror was formed from polished aluminum sheet commercially called "Coilzac" because it has proven to be a superior ultraviolet light reflecting material. The focus of the parabola is the center of the ultraviolet lamp cylinder. A radiation port 23, allows ultraviolet light emanating directly from the ultraviolet lamp to impinge directly onto the coated lens 4, as it passes by the port. Originally, such a parabolic reflector system was tried but it did not control much of the radiation emanating from the upper portion of the ultraviolet lamp. This radiation from the upper portion of the ultraviolet lamp is not collimated and much of it missed the moving lens. Also, the radiation flux uniformity on the lens was not acceptable. The inventors collimated and concentrated the radiation impinging on the lens by adding a "director" 25, comprised of two substantially parallel reflectors which reflect "stray" radiation to the lens. For example, with only a parabolic reflector, the rays emanating from the upper 180 angular degree arc of the lamp such as ray 72, and ray 73, would have passed out through the port and missed the lens. With the director in place, ray 72, impacting the reflector at angle of incidence $\alpha$, would reflect as ray 72R, reflected at angle $\alpha$, and strike the lens and similarly, ray 73, impacting the reflector at angle of incidence $\beta$, which would reflect as ray 73R, reflected at angle $\beta$, would also strike the lens. Similarly, the other rays striking the director would add to the radiation flux striking the lens. This results in a requirement for a smaller more economical lamp, lower operating wattage and lower system cost. The director was also made from "Coilzac" aluminum alloy.

A substantially planar director is illustrated herein but the inventors believe that a director that is formed from segments of a parabola, or other substantially conic or aspheric section could result in further improvement of quantity and of the uniformity of the deposited flux.

Figure 6:
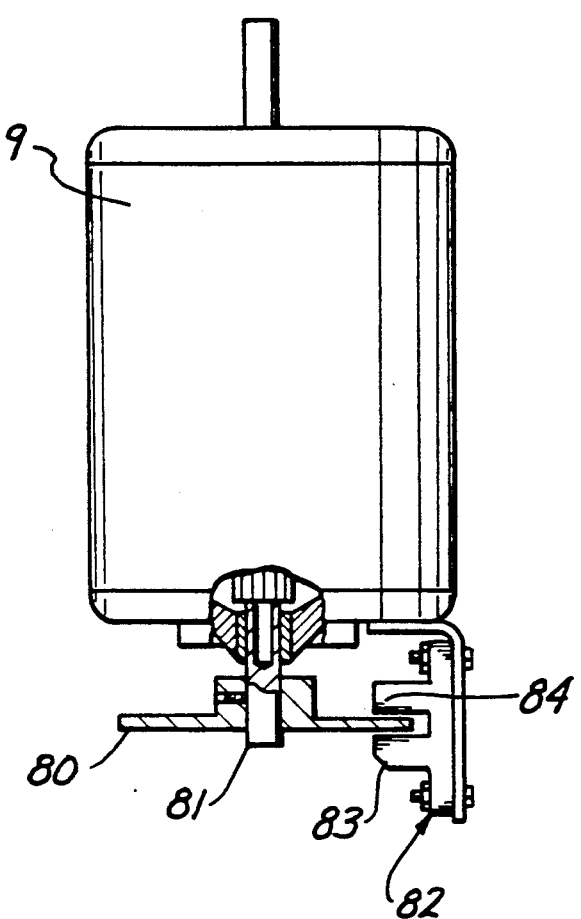
FIG. 6 is a schematic of the drive motor speed control sensor.

FIG. 6 illustrates how the drive motor speed control operates. Variable speed motor 9, has a precision light chopper wheel 80, mounted on one end of its output shaft 81. The light chopper wheel has numerous equally spaced radial slots cut into its periphery or equally spaced holes on a radius near the outer edge. Some chopper wheels are merely spur gears and others are perforated by a series of holes. The form of the wheel and its slots or holes is unimportant. An infra-red sensor assembly 82, has an infra-red light source on one leg 83, which is aimed at an infra-red detector on the opposite leg 84. In this type of sensor assembly, the infra-red detector emits a voltage when it is illuminated by the infra-red light source. When the slotted, perforated or toothed chopper wheel rotates, it periodically blocks the light reaching the detector and the detector emits a modulated (continuous wave or pulsed) signal whose frequency is a direct product of the rotational speed and the number of slots (perforations) in the chopper wheel.

Generated frequency = $(\Omega)*N$ = cycles/second where:

$\Omega$ = rotational speed, revolutions/second

N = number of slots or perforations on the chopper wheel

Very accurate speed sensing is attained because the motor speed is multiplied by the number of light slots (interruptions) in the chopper wheel and a small change in speed produces a relatively large change in frequency. The control system changes the wattage of the motor power supply to accurately control its speed in response to its preprogrammed cycle speed, using the chopper wheel generated signal as feedback in a closed loop speed controller.

Figure 7:
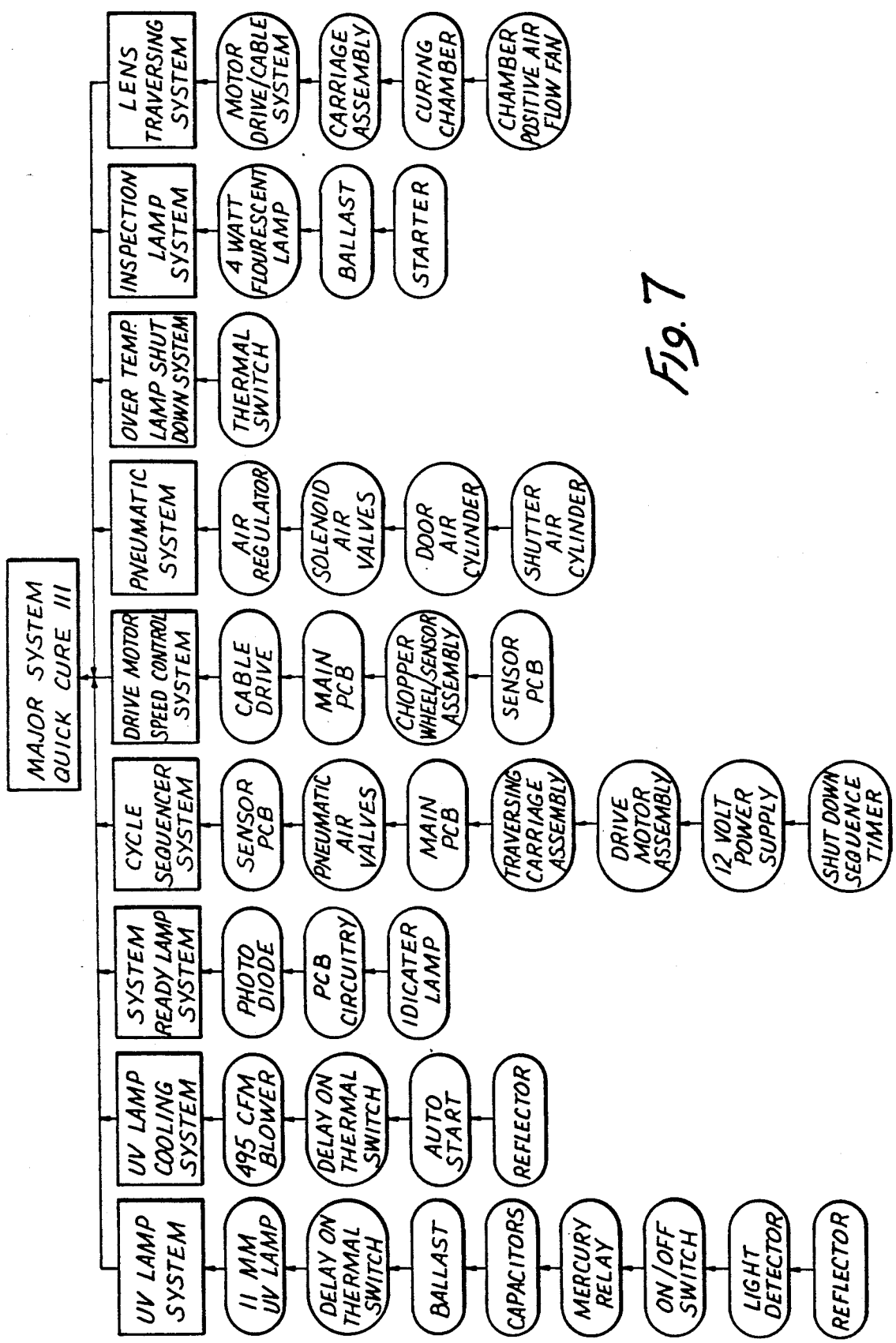
FIG. 7 is a block diagram of the entire system.

FIG. 7 is a block diagram of the entire system with more detailed arrangements of how components and logic flow.

Figure 8:
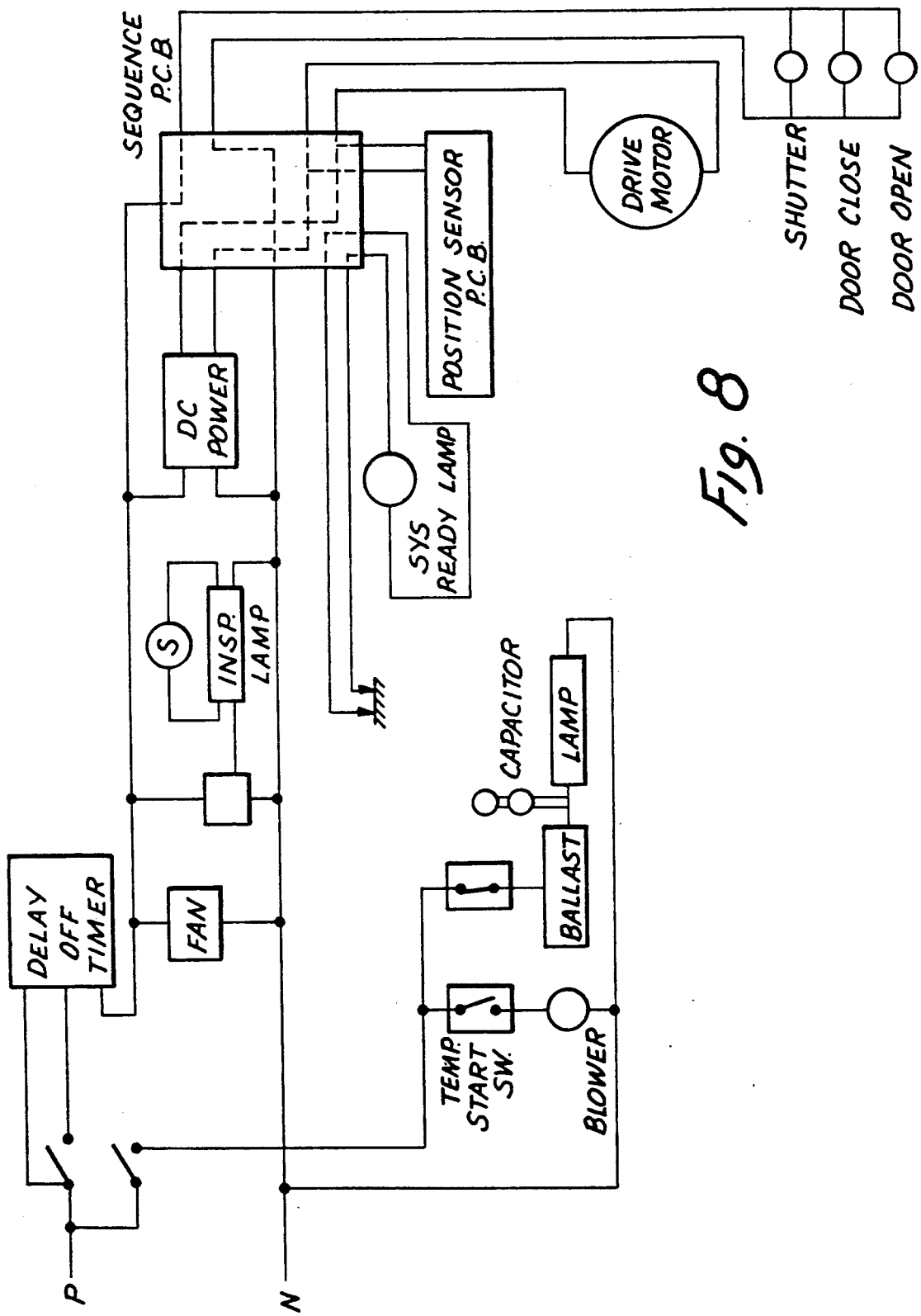
FIG. 8 is an electrical wiring diagram for the invention.

FIG. 8 is a simplified electrical wiring diagram for the invention showing the general electrical arrangement. It also shows that some components operate on DC while others such as the ultraviolet lamp, fan and blower operated on AC.

Figure 9:
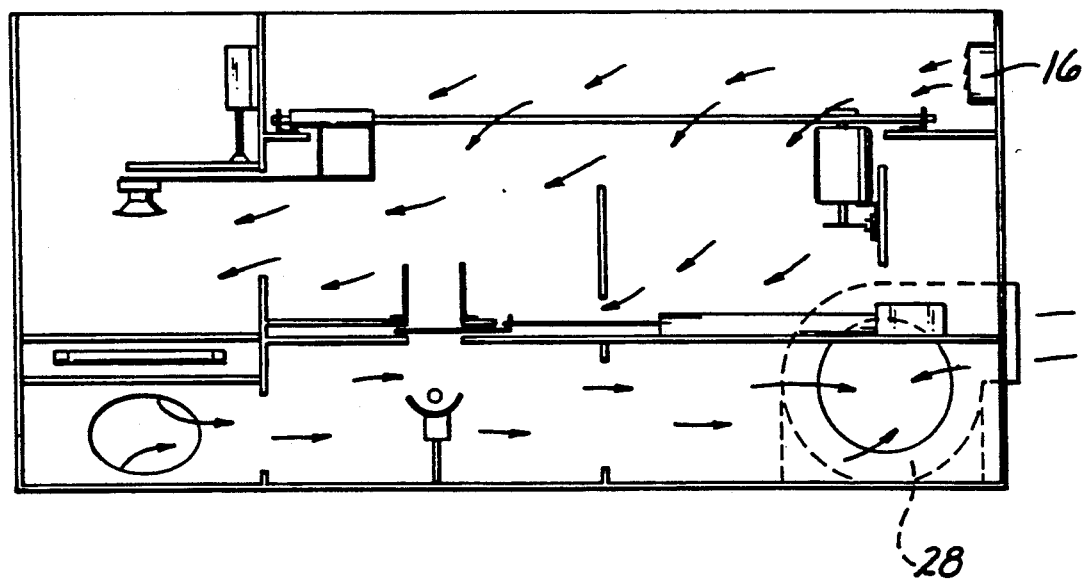
FIG. 9 is a cooling schematic air flow diagram for the entire apparatus.

FIG. 9 is a cooling schematic air flow diagram for the entire apparatus. It shows that a fan blows filtered outside air over the linear drive system and upper compartments to exit by means of the normally open outer door. This continual outward air flow prevents stray dust and particulates from entering the inner part of the apparatus and degrading the optical system, the traversing lens and other components. Air for cooling the ultraviolet light system enters through a filtered opening in the lower compartment, travels past the lamp system (see FIG. 4) and exits into the inlet of a powerful centrifugal squirrel cage blower 28, which forces it out to atmosphere.

The advantages of this construction over previous designs are as follows:

1. Cost of construction is low due to the simple cable drive linear transport system, commercial pneumatic door and shutter actuators/valves and simple ultraviolet reflector and collimating system.
2. Precise repeatable lens ultraviolet radiation fluence exposures are obtained by generating very precise traverse speeds across the radiation field through the use of a solid state variable frequency generator (directly coupled precision light chopper wheel) on the direct current drive motor which allows the control system to accurately measure and maintain motor speed. This system allows the user to make changes in ultraviolet fluence exposures electrically by moving a switch and/or by turning a potentiometer. No mechanical speed change device such as change gears or variable pulleys are required.
3. Reliability and reduced maintenance are assured by using solid state infra-red sensors to detect motion and position of moving parts in place of the limited life common mechanical switches that are commonly used in the industry.
4. The coated lens is shielded from settling dust and particulates during loading/unloading and processing because it enters the apparatus, traverses the apparatus and is removed from the apparatus in an inverted position with the coated surface facing down.
5. A positive continuous flow of filtered air is maintained within the apparatus so that exiting air flow is always directed outward from the apparatus through the outer door and other openings to prevent entry of dust and particulates into the apparatus. This keeps the coated lens and the internal optical parts of the apparatus clean. No internal recirculation of air is used.
6. An inspection light at the loading/unloading station allows the operator to detect and reject lenses with dirty coatings prior to processing and to detect if the apparatus is contaminating treated lenses because filters are clogged or leaking.
7. An ultraviolet flux detector connected to the control system senses when the ultraviolet lamp output is insufficient and the controller causes a warning lamp to flash on the control panel and alert the operator that a replacement ultraviolet lamp is required. This prevents improper curing of lenses due to aging or failure of the ultraviolet lamp.
8. Because the operation of the lens curing system is very simple, completely automatic and does not rely on operator skill, cost of operator training is minimized and unskilled operators with a low labor grade can be used at minimal labor cost, thereby making the invention economically beneficial.
9. The combination of a simple cylindrical parabolic reflector in combination with substantially parallel plate director reflectors results in an inexpensive radiation collimation system that deposits a nearly bell shaped flux pattern on the lens surface as it traverses the director opening.
10. The design of a simple labyrinth air cooling system allows the cooling the lamp terminals, the lamp body, the parabolic reflector and the lamp chamber with metered amounts of filtered air without overcooling the lamp body and causing thermal stresses. The lamp terminals are flexibly mounted to avoid stresses caused by thermal expansion. This effective metered quantity cooling system prolongs ultraviolet lamp life and keeps internal components at or below their rated operating temperatures to enhance reliability and prolong life. Filtering inlet air also keeps the interior of the apparatus clean. A temperature sensitive thermal switch enables the cooling blower after the ultraviolet lamp is at the proper operating temperature. Electrical parts such as ballast and power capacitors are mounted in the lower part of the apparatus directly in the cooling air path so that they are maintained at a constant safe operating temperature.

11. Because the heavy electrical parts such as ballast and power capacitors are mounted in the lower part of the apparatus, they also act as a counterweight which enables the entire apparatus to be turned 90 degrees on its side for easy access to change the ultraviolet lamp through the bottom panel. Unlike other installations, there is therefore no need to disassemble the apparatus when the operator replaces the ultraviolet lamp.

12. Because the drive motor speed is readily changeable by the control system as a function of position of the lens, the transport speed, which is the speed that the coated lens moves from station to station within the apparatus, can be set at a uniform high speed to reduce overall lens curing processing time. The transport speed can be reduced only where required, to the selectable cycle (curing) speed for the lens exposure to the ultraviolet light radiation and therefore, the processing time is minimized.

13. Because the ultraviolet lamp can be continuously energized during processing of lenses, it will operate at a nearly uniform temperature, experience few starting transients and have a long life compared with installations which require the lamp to be energized and de-energized for each lens that is treated. Also in the invention, the process time will be decreased because the lamp transient time is zero between lenses.

An alternate description of the invention for curing photosensitive lens coatings is given below:

1. The invention is an apparatus for automatic rapid curing of photosensitive coatings on eyeglass lenses with ultraviolet light comprising:
    (a) a housing,
    (b) a linear transport means for moving a lens to various stations within the apparatus,
    (c) a lens transport carriage attached to the linear transport means to hold the lens,
    (d) an outer light blocking door which opens to allow inward and outward passage of the lens only when ultraviolet radiation can not escape through the door opening,
    (e) a continuously energized ultraviolet lamp in an enclosed lamp chamber,
    (f) a light blocking shutter that opens to allow ultraviolet radiation to exit the enclosed lamp chamber and reach the lens,
    (g) a reflector system to aim and concentrate the ultraviolet radiation on the lens coating,
    (h) a precision adjustable automatic electronic programmer (controller) to control process cycling, ultraviolet intensity, ultraviolet radiation time, lens transport direction and speed through the apparatus, and door/shutter opening and closing,
    (i) a control panel to allow the operator to switch the apparatus on or off, to manually select cycle parameters and to start or stop the curing process,
    (j) multiple position sensing means to signal the control system with the location of the lens during its passage through the apparatus,
    (k) a precision speed sensor means combined with a speed control means to allow the control system to set and change the linear speed of the lens at precise points in its passage through the apparatus, and
    (l) a filtered forced air cooling system that prevents flow of unfiltered air into the apparatus.

2. The apparatus described in Paragraph 1 above in which the linear lens transport means is a continuous belt means driven by a variable speed reversible electric motor.

3. The apparatus described in Paragraph 1 above in which the linear lens transport means is a continuous chain driven by a variable speed reversible electric motor.

4. The apparatus described in Paragraph 1 above in which the linear lens transport means is a non-rotating nut engaging a rotating screw driven by a variable speed reversible electric motor.

5. The apparatus described in Paragraph 1 above in which the linear lens transport means is a non-rotating screw engaging a rotating nut driven by a variable speed reversible electric motor.

6. The apparatus described in Paragraph 1 above in which the outer door is actuated by a pneumatic actuator coupled with a solenoid valve.

7. The apparatus described in Paragraph 1 above in which the light blocking shutter is actuated by a pneumatic actuator coupled with a solenoid valve.

8. The apparatus described in Paragraph 1 above in which the position sensing means operate with infra-red light to avoid interference and false signals from the high intensity ultraviolet light within the apparatus.

9. The apparatus described in Paragraph 1 above in which the speed sensor is a rotating light chopper (perforated or slotted) wheel directly mounted on the drive motor shaft, in combination with a stationary infra-red sensor that signals the control system every time that said light chopper wheel interrupts its infra-red beam to provide a pulsed signal directly proportional to rotational speed of the motor.

10. The apparatus described in Paragraph 1 above in which the ultraviolet lamp can be removed and replaced from the bottom of the casing by opening an access panel.

11. The invention also encompasses an optical system for collimating and controlling ultraviolet light emanating from a cylindrical ultraviolet lamp for curing photosensitive coatings on lenses comprising:
    (a) a two dimensional parabolic mirror, parallel to and surrounding an approximately 180 angular degree arc of a horizontal cylindrical ultraviolet lamp, with the lamp centered at its focal point and with said reflector approximately as long as the lamp,
    (b) a horizontal rectangular radiation port in an opaque horizontal partition over the parabolic mirror with its longer sides as long as the lamp and parallel to the lamp and parabolic reflector axes, and its shorter sides as wide as the parabolic mirror to allow ultraviolet light emanating directly from the ultraviolet lamp and reflected from said parabolic mirror to pass through the port to impinge directly onto the coated lens, and
    (c) two substantially parallel/planar reflectors of length approximately equal to the radiation port, with each reflector mounted on the long edge of the radiation port and oriented so as to be a vertical continuation of the radiation port, with a height that allows sufficient clearance for a horizontally traversing coated lens to clear said reflectors.
12. The optical system of Paragraph 11 above in which the two vertically oriented planar reflectors are made non-parallel with their upper edges closer together than their lower edges at the radiation port so as to optimize the ultraviolet light intensity distribution for some lens coatings,
13. The optical system of Paragraph 11 above in which the two vertically oriented planar reflectors are made non-parallel with their upper edges further apart than their lower edges at the radiation port, so as to optimize the ultraviolet light intensity distribution for some lens coatings,
14. The optical system of Paragraph 11 above in which the two vertically oriented reflectors are made of two dimensional non-planar surfaces with their curvature specified by one or more conic curves such as parabolas, hyperbolas, ellipses, etc.

PREFERRED EMBODIMENT

The preferred embodiment for the invention uses thin sheet metal (steel and aluminum sheet) to fabricate the framework and structure of the apparatus. Thickness of the metal is unimportant but the outer cover and internal structure were fabricated from 6061-T6 aluminum alloy. This was selected because of its strength, formability, machinability, excellent thermal conductivity and corrosion resistance.

The shutter was fabricated from 6061-T6 aluminum as a reinforced flat plate to slide back and forth on "teflon" guides. Teflon plastic was chosen for the guides because of its excellent heat resistance, low sliding friction coefficient and durability in a sliding application. The teflon was treated on one side to allow the use of adhesive for fastening the teflon to the shutter. Commercially available General Electric #167 silicone adhesive was selected for fastening the teflon to the shutter because of the adhesive's strength and resistance to ultraviolet light. The shutter is actuated by a commercially available pneumatic cylinder assembly such as a Bimba #013R which has a return spring to automatically return the shutter to its normally closed position in the event of loss of air pressure. This protects the operator from exposure to ultraviolet radiation. The threaded pneumatic cylinder piston rod fastens the cylinder to the shutter. An electrically operated solenoid valve supplies pressurized air to the pneumatic cylinder to open the shutter when the control system energizes the valve. Compressed air is obtained from a conventional compressed air supply that is usually present in the user's facility. The supply air pressure may be regulated to a lower pressure if desired.

The commercially manufactured power supply supplies 15 VDC (volts, direct current) to the sequencer. The sequencer controls all functions with the exception of the ultraviolet lamp which is operated separately. Therefore, turning the ultraviolet lamp on or off does not affect operation of the motor driven and mechanical parts of the apparatus.

The lens entry door is operated by a pneumatic cylinder such as a Bimba Mfg. Co. model #011.5P. An electrically operated solenoid valve supplies pressurized air to the pneumatic cylinder to open the door when the control system energizes the valve in response to the lens carriage motion past the various infra-red sensors.

The electric drive motor that moves the lens carriage is a Barber Coleman gear motor, part #CYQC42BOO-35-5 with a gear reduction ratio of 35:1. 15 VDC electric power is supplied to the motor. To produce precise motor rotational speeds, a light chopper wheel 1.5 inches in diameter with eight equally spaced 0.050 inch wide radial slots was mounted on an extended rear shaft. The light chopper wheel is arranged to periodically interrupt the infra-red light path on a sensor attached to the motor frame. These pulses are transmitted to the control system (feedback) which compares the pulse frequency with a reference frequency that is established by a variable potentiometer setting. The control system maintains a rotational frequency equal to the reference frequency by increasing or decreasing power to the motor accordingly. This results in very precise feedback type of speed control.

The commercially available Western Quartz #UL04C ultraviolet lamp is a cylindrical tubular lamp 11-12 mm in diameter that is available from various manufacturers. This lamp type emits the proper spectral response for curing photosensitive lens coatings and operates at a nominal power of 250-300 watts/inch of length. The power is controlled by a mercury wetted contact electrical relay such as the Mercury Displacement Inc. part #35NC-12DT. The relay switches appropriate capacitors in and out of the lamp circuit in conjunction with the cycle selection switch on the apparatus control panel. The relay is turned on and off by the control system.

The main cooling blower is a 110 VAC Dayton Mfg. Co. 495 CFM squirrel cage blower and the 110 VAC cooling fan is a common axial flow silent muffin fan as is used to cool audio and electronic equipment.

Interior finishes of the apparatus were chosen to resist ultraviolet radiation which destroys ordinary paints in short order. The ultraviolet lamp chamber is zinc plated and corrosion free. The lens radiation chamber is black anodized to absorb light and reduce reflection. This provides better control of light flux and fluence on the treated lens. The black surface also absorbs radiated heat and transmits it to the exterior to help keep the radiation chamber cool. External apparatus surfaces are coated with a polyurethane polymer to enhance resistance to chemical corrosion and to improve durability.

Heavy electrical parts such as ballast and power capacitors are mounted in the lower part of the apparatus directly in the cooling air path. They also act as a counterweight which enables the entire apparatus to be turned 90 degrees on its side for easy access to change the ultraviolet lamp through the bottom panel.

While certain exemplary embodiments of this invention have been described above and are shown in the accompanying drawings, it is to be understood that such embodiments are merely illustrative of, and not restrictive on, the broad invention and that we do not desire to be limited in our invention to the specific constructions or arrangements shown and described, because various other obvious modifications may occur to persons having ordinary skill in the art.

What is claimed is:
1. An apparatus for automatic rapid curing of photosensitive coatings on eyeglass lenses with ultraviolet light comprising:
   (a) a housing,
   (b) a linear transport means for moving a lens to various stations within the apparatus,

(c) a lens transport carriage attached to the linear transport means to hold the lens, (d) an outer light blocking door which opens to allow inward and outward passage of the lens only when ultraviolet radiation can not escape through the door opening, (e) a continuously energized ultraviolet lamp in an enclosed lamp chamber, (f) a light blocking shutter that opens to allow ultraviolet radiation to exit the enclosed lamp chamber and reach the lens, (g) a reflector system to aim and concentrate the ultraviolet radiation on the lens coating, (h) a precision adjustable automatic electronic programmer (controller) to control process cycling, ultraviolet intensity, ultraviolet radiation time, lens transport direction and speed through the apparatus, and door/shutter opening and closing, (i) a control panel to allow the operator to switch the apparatus on or off, to manually select cycle parameters and to start or stop the curing process, (j) multiple position sensing means to signal the control system with the location of the lens during its passage through the apparatus, (k) a precision speed sensor means combined with a speed control means to allow the control system to set and change the linear speed of the lens at any point in its passage through the apparatus, and (l) a filtered forced air cooling system that prevents flow of unfiltered air into the apparatus.

2. The apparatus of claim 1 in which the linear lens transport means is a belt means driven by a variable speed reversible electric motor.

3. The apparatus of claim 1 in which the linear lens transport means is a continuous chain driven by a variable speed reversible electric motor.

4. The apparatus of claim 1 in which the linear lens transport means is a non-rotating nut engaging a rotating screw driven by a variable speed reversible electric motor.

5. The apparatus of claim 1 in which the linear lens transport means is a non-rotating screw engaging a rotating nut driven by a variable speed reversible electric motor.

6. The apparatus of claim 1 in which the outer door is actuated by a pneumatic actuator coupled with a solenoid valve.

7. The apparatus of claim 1 in which the light blocking shutter is actuated by a pneumatic actuator coupled with a solenoid valve.

8. The apparatus of claim 1 in which the position sensing means operate with infra-red light to avoid interference and false signals from the high intensity ultraviolet light within the apparatus.

9. The apparatus of claim 1 in which the speed sensor is a rotating light chopper (perforated or slotted) wheel directly mounted on the drive motor shaft, in combination with a stationary infra-red sensor that signals the control system every time that said light chopper wheel interrupts its infra-red beam to provide a pulsed signal directly proportional to rotational speed of the motor.

10. The apparatus of claim 1 in which the ultraviolet lamp can be removed and replaced from the bottom of the casing by opening an access panel.

* * * * *